US012685026B2

(12) United States Patent
Liu et al.

(10) Patent No.: US 12,685,026 B2
(45) Date of Patent: Jul. 14, 2026

(54) METHOD FOR FORMING A MAMR STRUCTURE BASED ON A TMR—SPIN TORQUE OSCILLATOR (STO) HAVING SEED LAYER AND CAPPING LAYER OF METAL OXIDE

(71) Applicant: Taiwan Semiconductor Manufacturing Company, Ltd., Hsinchu (TW)

(72) Inventors: Huanlong Liu, San Jose, CA (US); Jian Zhu, San Jose, CA (US); Keyu Pi, San Jose, CA (US); Ru-Ying Tong, Los Gatos, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 96 days.

(21) Appl. No.: 18/782,714

(22) Filed: Jul. 24, 2024

(65) Prior Publication Data

US 2024/0381780 A1 Nov. 14, 2024

Related U.S. Application Data

(60) Division of application No. 17/230,605, filed on Apr. 14, 2021, now Pat. No. 12,414,476, which is a
(Continued)

(51) Int. Cl.
H10N 50/01 (2023.01)
G01R 33/09 (2006.01)
(Continued)

(52) U.S. Cl.
CPC ........... H10N 50/01 (2023.02); G01R 33/096 (2013.01); G01R 33/098 (2013.01);
(Continued)

(58) Field of Classification Search
CPC .... H10N 50/01; G01R 33/096; G01R 33/098; G11B 5/3912; G11B 5/3916
See application file for complete search history.

(56) References Cited

U.S. PATENT DOCUMENTS

| | | | |
|---|---|---|---|
| 6,347,049 B1 | 2/2002 | Childress | |
| 7,488,609 B1 | 2/2009 | Lin | |

(Continued)

FOREIGN PATENT DOCUMENTS

| | | |
|---|---|---|
| JP | 2003289163 A | 10/2003 |
| WO | 0004591 A1 | 1/2000 |
| WO | 2010044134 A1 | 4/2010 |

OTHER PUBLICATIONS

Slonczewki, J.C., "Current-driven excitation of magnetic multilayers", Journal of Magnetism and Magnetic Materials, 159 (1996), L1-L7, Jun. 1996.
(Continued)

*Primary Examiner* — Anh D Mai
(74) *Attorney, Agent, or Firm* — HAYNES AND BOONE, LLP

(57) ABSTRACT

A method of forming a MTJ with a tunnel barrier having a high tunneling magnetoresistance ratio, and low resistance x area value is disclosed. The method preserves perpendicular magnetic anisotropy in bottom and top magnetic layers that adjoin bottom and top surfaces of the tunnel barrier. A key feature is a passive oxidation step of a first Mg layer that is deposited on the bottom magnetic layer wherein a maximum oxygen pressure is 10-5 torr. A bottom portion of the first Mg layer remains unoxidized thereby protecting the bottom magnetic layer from substantial oxidation during subsequent oxidation and anneal processes that are employed to complete the fabrication of the tunnel barrier and MTJ. An
(Continued)

uppermost Mg layer may be formed as the top layer in the tunnel barrier stack before a top magnetic layer is deposited.

20 Claims, 8 Drawing Sheets

Related U.S. Application Data continuation of application No. 14/278,243, filed on May 15, 2014, now abandoned.

(51) Int. Cl.

| | | |
|---|---|---|
| *G11B 5/39* | (2006.01) | |
| *G11C 11/16* | (2006.01) | |
| *H01F 41/30* | (2006.01) | |
| *H10N 50/10* | (2023.01) | |

(52) U.S. Cl.

CPC .......... *G11C 11/161* (2013.01); *H01F 41/307* (2013.01); *H10N 50/10* (2023.02); *G11B 5/3909* (2013.01); *G11B 2005/3996* (2013.01)

(56) References Cited

U.S. PATENT DOCUMENTS

| | | | |
|---|---|---|---|
| 7,780,820 | B2 | 8/2010 | Zhao |
| 7,978,505 | B2 | 7/2011 | Zhou |
| 8,203,389 | B1 | 6/2012 | Zhou |
| 8,320,080 | B1 | 11/2012 | Braganca |
| 8,324,697 | B2 | 12/2012 | Worledge |
| 8,431,418 | B2 | 4/2013 | Choi |
| 8,492,169 | B2 | 7/2013 | Cao |
| 8,508,006 | B2 | 8/2013 | Jan |
| 8,557,407 | B2 | 10/2013 | Zhao |
| 8,582,240 | B1 * | 11/2013 | Chen ...................... G11B 5/399 |
| | | | 360/125.3 |
| 8,592,927 | B2 | 11/2013 | Jan |
| 8,609,262 | B2 | 12/2013 | Horng |
| 2006/0227466 | A1 | 10/2006 | Yagami |
| 2008/0151439 | A1 | 6/2008 | Pinarbasi |
| 2008/0182015 | A1 | 7/2008 | Parkin |
| 2008/0299679 | A1 | 12/2008 | Zhao |
| 2009/0122450 | A1 | 5/2009 | Wang |
| 2009/0251829 | A1 | 10/2009 | Zhang |
| 2010/0073827 | A1 | 3/2010 | Zhao |
| 2011/0014500 | A1 | 1/2011 | Horng |
| 2011/0086439 | A1 | 4/2011 | Choi |
| 2012/0075752 | A1 | 3/2012 | Sato |
| 2012/0139649 | A1 | 6/2012 | Zhou |
| 2012/0199470 | A1 | 8/2012 | Mori |
| 2012/0205758 | A1 | 8/2012 | Jan |
| 2013/0175644 | A1 | 7/2013 | Horng |
| 2014/0056061 | A1 | 2/2014 | Khvalkovskiy |
| 2015/0333254 | A1 | 11/2015 | Liu |

OTHER PUBLICATIONS

Chinese Office Action, File No. 201580032651.1, Applicant: Headway Technologies, Inc., Mail date: Sep. 5, 2018, 13 pages and English language translation, 13 pages.

European Search Report mailed Mar. 14, 2019, Application No. 18203007.2, 11 pages.

* cited by examiner

METHOD FOR FORMING A MAMR STRUCTURE BASED ON A TMR—SPIN TORQUE OSCILLATOR (STO) HAVING SEED LAYER AND CAPPING LAYER OF METAL OXIDE

This application is a divisional application of U.S. patent application Ser. No. 17/230,605, filed Apr. 14, 2021, which is a continuation application of U.S. patent application Ser. No. 14/278,243, filed May 15, 2014, the disclosures of which are herein incorporated by reference in their entireties.

RELATED PATENT APPLICATIONS

This application is related to U.S. Pat. Nos. 8,557,407, 8,592,927, 8,609,262, U.S. Publication No. 2012/0205758, and U.S. Publication No. 2013/0175644 each of which is herein incorporated by reference in its entirety.

TECHNICAL FIELD

The present disclosure relates to high performance Magnetic Tunneling Junction (MTJ) elements that include an oxide based tunnel barrier and/or oxide cap layer such as MgO, and in particular, to a method of forming the oxide layer to provide a low resistance x area (RA) product for good writability and reliability, and to protect (maintain) interfacial perpendicular anisotropy at interfaces with adjoining magnetic layers.

BACKGROUND

Magnetoresistive Random Access Memory (MRAM) is based on the integration of silicon CMOS with MTJ technology, and is a major emerging technology that is highly competitive with existing semiconductor memories such as SRAM, DRAM, and Flash. Spin-transfer (spin torque) magnetization switching described by C. Slonczewski in "Current driven excitation of magnetic multilayers", J. Magn. Magn. Mater. V 159, L1-L7 (1996), is important due to its potential application for spintronic devices such as Spin-Torque MRAM on a gigabit scale.

Both field-MRAM and Spin-Torque MRAM have a MTJ element based on a tunneling magneto-resistance (TMR) effect wherein a stack of layers has a configuration in which two magnetic layers called the reference layer and free layer are separated by a thin non-magnetic dielectric layer that is called a tunnel barrier layer, or more simply, the tunnel barrier. The MTJ element is typically formed between a bottom electrode such as a first conductive line and a top electrode which is a second conductive line at locations where the top electrode crosses over the bottom electrode.

In various designs of a Spin-Torque MRAM wherein one or both of the reference layer and free layer has perpendicular magnetic anisotropy (PMA), the tunnel barrier contributes to the write function by generating spin polarized current. A low RA product is needed for the tunnel barrier for good writability and good reliability. Theoretically, the current density needed to write one MRAM device depends only on the free layer properties. Therefore, lowering the RA value in the tunnel barrier means less voltage is required for writing. In addition, the write voltage is proportional to the stress applied on the tunnel barrier during a write operation. Too much stress will lead to an endurance problem, for example, that will affect the reliability of writing the same device multiple times without damaging the tunnel barrier.

It is commonly believed that although the strength of the tunnel barrier against applied voltages is reduced as RA decreases, the writing voltage is reduced even faster. As a result, one will improve writing reliability by reducing the tunnel barrier RA value. A well oxidized interface between the free layer and tunnel barrier is preferred to enhance PMA in the free layer. An oxidized cap layer on the free layer may further enhance PMA along a second interface with the free layer.

When a spin-polarized current transverses a magnetic multilayer in a current perpendicular-to-plane (CPP) configuration, the spin angular moment of electrons incident on a magnetic layer interacts with magnetic moments of the magnetic layer near the interface between the magnetic layer and non-magnetic spacer. Through this interaction, the electrons transfer a portion of their angular momentum to the magnetic layer. As a result, spin-polarized current can switch the magnetization direction of the free layer if the current density is sufficiently high, and if the dimensions of the multilayer are small. The difference between a Spin-Torque MRAM and a conventional MRAM is only in the write operation mechanism. The read mechanism is the same.

An important consideration when fabricating a tunnel barrier is the oxidation process employed to convert a metal layer into an oxide without creating cracks through which metal ions can easily migrate. The tunnel barrier is typically formed by deposition and oxidation of a thin Mg layer, and is required to have a low RA for good reliability. PMA in one or both of the free layer and reference layer must be maintained for optimum Spin-Torque MRAM performance. The origin of PMA is from the interface between the magnetic layer and the tunnel barrier where electron orbits at the interface have less symmetry than their counterparts in the bulk of the magnetic layer. Orbits that mostly maintain in the plane of the interface are energetically favorable, resulting in PMA in the magnetic layer. When oxidation conditions during the formation of the tunnel barrier are too strong, a magnetic layer that interfaces with the tunnel barrier may become partially oxidized, causing a loss of PMA. Thus, the oxidation process must be cleverly designed and carefully controlled to preserve PMA in adjoining magnetic layers.

For Spin-Torque MRAM applications, an ultra small MTJ element also referred to as a nanomagnet must exhibit a high TMR ratio or dR/R of about 100% or higher at low resistance x area (RA) values of less than 20 ohm-$\mu m^2$. Note that dR is the maximum change in resistance in a MTJ and R is the minimum resistance of the MTJ. In many cases, MgO is preferred as the tunnel barrier layer since it provides a higher MR value than other oxides. Improvements in tunnel barrier layer quality are still needed in order to preserve PMA while optimizing RA and TMR ratio in the device for Spin-Torque MRAM to be viable in the 90 nm technology node and beyond.

SUMMARY

One objective of the present disclosure is to provide a MTJ element that is able to satisfy design requirements for advanced MRAM and Spin-Torque MRAM devices wherein substantial PMA in one or both magnetic layers are required along with low RA of ≤20 ohm-$\mu m^2$, and a dR/R greater than 100%.

A second objective of the present disclosure is to provide a method for forming the MTJ in the first objective wherein the tunnel barrier is fabricated by an oxidation method that minimizes or prevents oxidation in the adjoining magnetic layers thereby preserving PMA therein and enabling a high TMR ratio.

According to one embodiment, these objectives are achieved by formation of a MTJ element wherein a stack includes a first or bottom magnetic layer and a second or upper magnetic layer that are separated by a tunnel barrier comprised substantially of a metal oxide. The metal oxide may be MgO, or other metal oxides used in the art, or may be a lamination of one or more different metal oxides. Moreover, the bottom magnetic layer may be a reference layer in a bottom spin valve configuration, a free layer in a top spin valve configuration, or another functional layer such as a polarizing layer in a three-terminal spin-transfer switching device. Furthermore, one or both of the bottom and top magnetic layers may be part of a synthetic antiferromagnetic (SAF) multilayer which contains two magnetic layers antiferromagnetically coupled across a non-magnetic layer (typically Ru) through Ruderman-Kittel-Kasuya-Yosida (RKKY) interaction. The metal oxide fabrication may comprise one or more oxidation steps wherein a first step is a passive oxidation with an oxygen pressure of $10^{-5}$ torr or less that is substantially weaker than subsequent oxidation steps where oxygen pressure is typically $10^{-3}$ torr or greater. In one aspect where the metal oxide is MgO, a composite tunnel barrier with a Mg/MgO configuration is formed after the one or more oxidation steps. The lower Mg layer contacts the bottom magnetic layer and has a substantially smaller thickness than the overlying MgO layer. Oxidation steps following the initial passive oxidation may involve conventional oxidation processes including but not limited to sequential deposition of one or more metal layers wherein each metal deposition is followed by an oxidation in which the oxygen pressure is typically about $10^{-3}$ torr or greater, or at least 10 to 100 times higher than in the initial passive oxidation step. Thus, a lower portion of the MgO layer is formed by passive oxidation while an upper portion is formed by one or more conventional methods such as natural oxidation (NOX), or by direct deposition such as radio frequency (RF) sputtering of MgO which may require no further oxidation steps.

The metal oxide may have a laminated oxide structure wherein two different metals or alloys ($M_1$, $M_2$) are employed such that the tunnel barrier has a $M_1/M_1Ox/M_2Ox$ configuration where a first metal oxide ($M_1Ox$) is formed by a passive oxidation method and $M_2Ox$ is a second metal oxide that is formed by direct deposition or by one or more conventional oxidation steps having an oxygen pressure of $10^{-3}$ torr or greater. $M_1$ and $M_2$ are selected from Mg, MgZn, Zn, Al, Ti, AlTi, CoMg, Ta, MgTa, Hf, and Zr. After annealing, the tunnel barrier has a $M_1Ox/M_2Ox$ configuration.

The present disclosure also anticipates a dual spin valve design having a reference layer 1/tunnel barrier 1/free layer/tunnel barrier 2/reference layer 2 stack or a free layer 1/tunnel barrier 1/reference layer/tunnel barrier 2/free layer 2 stack where both tunnel barriers are made by an oxidation process as described herein. One or both tunnel barriers may be MgO, MgZnO, ZnO, AlOx, TiOx, AlTiOx, CoMgO, TaOx, MgTaOx, HfOx, or ZrOx, or one or both tunnel barriers have a laminated oxide structure as explained above.

After the MTJ stack is completed by depositing the top magnetic layer on the tunnel barrier and then depositing one or more overlying layers such as a capping layer, an anneal process is used to promote a high TMR ratio. Under certain annealing conditions, oxygen in the one or more metal oxide layers of the tunnel barrier may diffuse into the lower Mg layer to form a substantially uniform tunnel barrier where a metal oxide that is preferably MgO interfaces with the bottom magnetic layer and the top magnetic layer to promote PMA in the adjoining magnetic layers for greater thermal stability. The lower Mg layer serves as a buffer to limit the amount of oxygen reaching the bottom magnetic layer so that undesired oxidation is avoided. In other words, the lower Mg layer, or M1 layer in an alternative embodiment, prevents the bottom magnetic layer from being oxidized to an extent that PMA is degraded. In addition, higher TMR ratio is realized.

In a preferred embodiment that relates to fabricating a tunnel barrier in a bottom spin valve MTJ configuration, a first Mg layer about 1 to 6 Angstroms thick is deposited on a top surface of the reference layer. The reference layer may have intrinsic PMA that is enhanced by contact with an appropriate seed layer along a bottom surface of the reference layer. Then a passive oxidation comprised of an oxygen pressure of $10^{-5}$ torr or less is applied to oxidize an upper portion of the first Mg layer while a bottom portion of the Mg layer along an interface with the reference layer remains unoxidized. Thereafter, the tunnel barrier formation process continues with one or more conventional oxidation steps. In one embodiment, a second Mg layer is deposited on the partially oxidized first Mg layer. The second Mg layer is essentially completely oxidized by a second oxidation process such as a natural oxidation (NOX) involving an oxygen pressure of $10^{-3}$ torr or higher. Thus, the second oxidation involves substantially stronger oxidation conditions than the first passive oxidation. Conditions for the NOX step are selected so that oxygen does not penetrate into the weakly oxidized Mg layer and cause further oxidation therein. A third Mg layer may be deposited on the second oxidized Mg layer. Next, a free layer is deposited on the third Mg layer or on the oxidized second metal oxide layer followed by one or more layers such as a capping layer to complete the MTJ stack. Finally, an anneal process is performed by heating the MTJ stack at a temperature up to 450° C. for a duration up to 90 minutes. As a result, the first and third Mg layers absorb oxygen from the adjoining second oxidized Mg layer to form a MgO tunnel barrier.

In a second embodiment, a third Mg layer is deposited on the second oxidized Mg layer and a third oxidation process is performed to form a third oxidized Mg layer before sequentially depositing a fourth Mg layer, depositing the free layer and one or more overlying layers, and applying an annealing process to form a reference layer/MgO tunnel barrier/free layer configuration and complete the formation of the MTJ stack. In yet another embodiment, the fourth Mg layer in the second embodiment is treated with a fourth oxidation process to form a fourth oxidized Mg layer. Then a fifth Mg layer, free layer and one or more overlying layers are deposited, and an annealing step is performed to yield a MgO tunnel barrier. In all oxidations after the initial passive oxidation step, oxygen pressure is at least 100 times higher than in the first oxidation step. Optionally, a MgO or metal oxide layer may be deposited by RF sputtering as the uppermost layer in the tunnel barrier stack.

The MTJ stack is an improvement over the prior art since oxidation of the bottom magnetic layer that is a reference layer in a bottom spin valve is minimized or avoided such that PMA is preserved in the bottom magnetic layer. In other words, PMA is enhanced compared with prior art MTJ structures where overoxidation of the bottom magnetic layer causes a loss of PMA. The benefits of enhanced PMA in the bottom magnetic layer are higher TMR ratio and a reduction in RA which leads to better writing performance and reliability.

The present disclosure also encompasses a spin torque oscillator (STO) structure wherein PMA in a spin polarization layer is preserved and enhanced by an adjoining metal oxide layer that is formed by an oxidation process comprising a passive oxidation as defined herein.

In another embodiment relating to a three terminal device where read and write circuits are separated by placing a conductive layer between a STO stack and a RF generator, a tunnel barrier made by an embodiment of the present disclosure may be used in the RF generator stack of layers.

In yet another embodiment relating to a three terminal spin-transfer switching device where the read and write circuits are separated through the electrical terminals on a polarizing layer, free layer, and reference layer, an oxidation process according to an embodiment of the present disclosure may be used to fabricate the tunnel barrier between the free layer and reference layer in the read circuit, and the low RA tunnel barrier between the free layer and polarizing layer in the write circuit.

DETAILED DESCRIPTION

The present disclosure is a method of forming a high performance MTJ element for an ultra high density MRAM, Spin-Torque MRAM, or Spin Torque Oscillator (STO) device wherein RA is reduced, and PMA is better preserved in one or both of a free layer and reference layer by employing a tunnel barrier formation process that prevents substantial oxidation of the free layer and reference layer. Meanwhile, a first (oxide/reference layer) interface and a second (oxide/free layer) interface are used to generate interfacial perpendicular anisotropy and enhance PMA in the adjoining magnetic layers.

As magnetic devices require higher areal density, MTJ elements tend to become smaller with shrinking in-plane dimensions and thicknesses for layers including the reference/pinned layer, tunnel barrier, and free layer. Control of the tunnel barrier oxidation process is especially critical in order to generate a uniform tunnel barrier with low RA in perpendicularly magnetized MTJ devices. In the prior art, formation of MgO and other tunnel barrier oxides has been accomplished with a single oxidation or with multiple oxidation steps applied in a sequential manner to a plurality of Mg layers, or by direct deposition of a metal oxide (MgO) layer. Typically, the oxidation steps involve oxidation conditions with oxygen pressure greater than $10^{-3}$ torr in order to achieve the desired RA and TMR ratio. However, prior art MgO fabrication is not compatible with next generation MTJ devices where the magnetic layers at top and bottom surfaces of the tunnel barrier preferably have PMA in order to promote higher thermal stability while maintaining a high TMR ratio. In particular, CoFeB layers in a CoFeB/MgO/CoFeB reference layer/tunnel barrier/free layer design that were previously in the 20-30 Angstrom thickness range are now approaching 10 Angstroms thick or less in order to improve the PMA properties therein. Accordingly, it becomes necessary to develop an improved MgO fabrication process that is compatible with the new reference layer and free layer design requirements. A higher degree of control must be incorporated in the MgO (or metal oxide) fabrication to avoid or minimize oxygen incursion into the adjoining magnetic layers while reducing the number of cracks in the metal oxide layer that might degrade properties such as the RA value.

Figure 1:
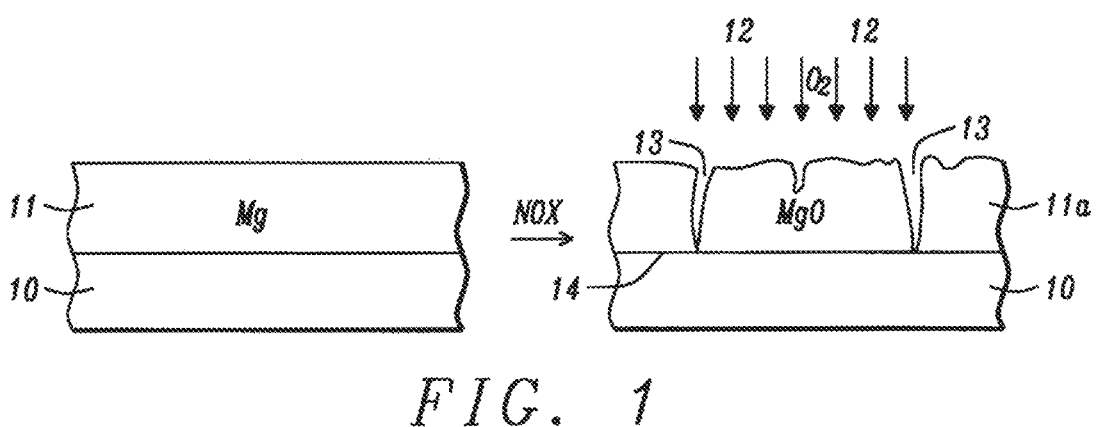
FIG. 1 is a cross-sectional view showing a conventional oxidation method to form a metal oxide tunnel barrier layer where oxygen pressure and process time are large enough to cause cracks that extend to an underlying magnetic layer.

As shown in FIG. 1, conventional oxidation 12 of a Mg layer 11 that is deposited on a reference layer 10 generates cracks 13 in the resulting MgO barrier 11$a$ such that a certain number of cracks extend to an interface 14 with the reference layer. The cracks are formed due to the fact that MgO has a smaller lattice than Mg. Cracks allow oxygen diffusion during a subsequent oxidation process into a CoFeB magnetic layer, for example, that lead to undesirable RA and TMR ratio.

We have discovered an improved tunnel barrier process that may be applied to the formation of MgO or related oxides such as AlOx, MgTaOx, TiO, ZnO, and native CoFeB oxide. The key aspect is to insert two extra steps comprising a thin metal (Mg) layer deposition followed by a passive oxidation involving an oxygen pressure of 10.5 torr or less. Thereafter, one or more metal layers are deposited and each deposition is followed by a conventional oxidation having an oxygen pressure of at least $10^{-3}$ torr. Passive oxidation as defined herein means that the kinetic energy of the oxygen atoms in the flow is essentially at the minimum level that is reproducible in a manufacturing environment. Typically, the pressure of the oxygen flow is less than $10^{-5}$ torr, and preferably about $10^{-6}$ torr during passive oxidation. In conventional oxidation methods, the pressure of oxygen flow is usually above $10^{-3}$ torr, and at least 10 to 100 times greater than in passive oxidation. The unusually weak oxidation condition applied in the passive oxidation step is employed to minimize the extent of oxidation of the thin metal layer to prevent oxygen diffusion into an underlying (bottom) magnetic layer and to avoid cracks that extend through the thin metal layer to a top surface of the bottom magnetic layer.

According to a preferred embodiment wherein the thin metal layer is Mg, only a top surface of the Mg layer is gently oxidized by passive oxidation to form a first MgO layer whereas the bottom portion of the Mg layer and the bottom magnetic layer remain unoxidized. Moreover, the gently oxidized first MgO layer will prevent oxygen during subsequent oxidation steps from causing a substantial amount of oxidation in the bottom magnetic layer, even when standard oxidation conditions comprising ≥103 torr oxygen pressures are employed to oxidize subsequently deposited metal layers to complete the tunnel barrier formation. One or more additional metal oxide layers may be formed on the oxidized upper portion of the first metal (Mg) layer. The one or more additional metal oxide layers may be formed by (a) direct deposition of a metal oxide by a conventional method such as sputtering a metal oxide target, or by (b) depositing a metal layer and then oxidizing with a process comprising an oxygen pressure of at least $10^{-3}$ torr. It should be understood that when two or more metal oxide layers are formed on a top surface of the oxidized portion of the first metal layer, any combination or repetition of steps (a) and (b) above may be used to form a plurality of metal oxide layers. However, passive oxidation is a key discovery that enables PMA of the bottom magnetic layer to be better preserved than in prior art tunnel barrier fabrications where only conventional methods are used to form one or more metal oxide layers.

In a first embodiment depicted in FIGS. 2-6, a series of process steps are employed to fabricate a tunnel barrier and begin with deposition of a first metal layer on a bottom magnetic layer followed by a passive oxidation. Then, a second metal layer is deposited and is oxidized by a conventional oxidation method. A third (upper) metal layer may be deposited on the oxidized second metal layer. In the exemplary embodiments, Mg is used as the metal for tunnel barrier fabrication. However, one or more other metals including Al, Ta, Zn, Ti, and Sn, may be selected instead of Mg. For example, the first (lower) metal layer and upper metal layer may be comprised of a first metal or alloy while one or more intermediate metal layers may be selected from a second metal or alloy unequal to the first metal or alloy. However, for the purpose of improving throughput, all metal layers are preferably selected from the same metal or alloy.

Figure 2:
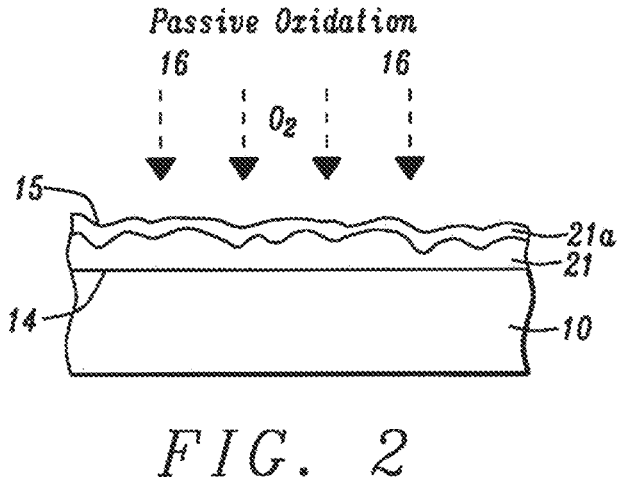
FIG. 2 is a cross-sectional view depicting the result of a passive oxidation process where a thin metal layer is preserved at an interface with a bottom magnetic layer in a bottom spin valve configuration after an initial tunnel barrier oxidation step according to a first embodiment of the present disclosure.
Figure 10:
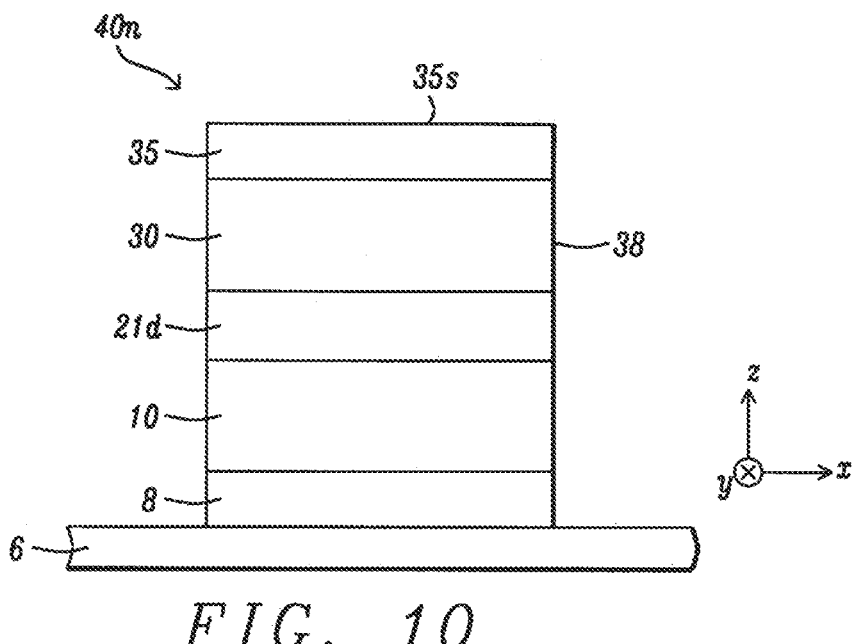
FIG. 10 is a cross-sectional view depicting a MTJ nanopillar having a bottom spin valve configuration according to an embodiment of the present disclosure.

Referring to FIG. 2 that relates to a MTJ having a bottom spin valve configuration, a bottom magnetic layer that is reference layer 10 is provided and may be Co, CoFeB, or another alloy comprising two or more of Co, Fe, Ni, and B and deposited on a seed layer 8 (FIG. 10). Furthermore, the bottom magnetic layer may be a composite with a lower laminated stack of layers such as (Co/Ni), in which n is a lamination number. The laminated stack is preferably formed on a seed layer and there may be an upper CoFeB layer (not shown) to give a (Co/Ni) n/CoFeB configuration, for example. However, an $(A1/A2)_n$ laminate may be selected rather than $(Co/Ni)_n$. A1 may be Co, CoFe, or a CoFeR alloy where R is one of Ru, Rh, Pd, Ti, Zr, Hf, Ni, Cr, Mg, Mn, or Cu. A2 may be Ni, NiCo, NiFe, Pt or Pd. Preferably, Co, CoFeB, or the alloy that is the uppermost layer in the bottom magnetic layer is less than about 20 Angstroms thick to enable intrinsic perpendicular magnetic anisotropy (PMA) that is enhanced when forming an interface with MgO or a metal oxide tunnel barrier in a later step.

Figure 12:
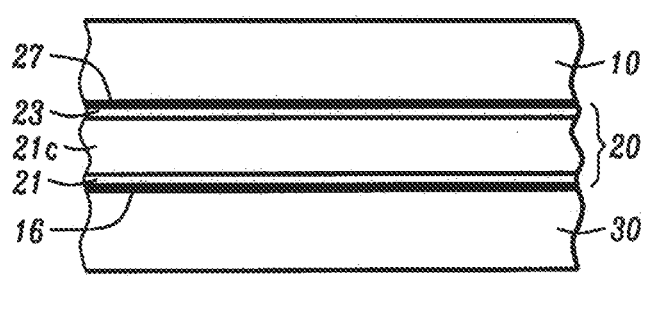
FIG. 12 is a cross-sectional view of a partially formed MTJ wherein a metal/metal oxide stack and an upper magnetic layer are formed on a bottom magnetic layer in a top spin valve configuration.

In an alternative embodiment relating to a top spin valve configuration in FIG. 12, the reference layer 10 becomes the top magnetic layer while the free layer 30 is the bottom magnetic layer. In this case, the top magnetic layer may have a CoFeB/(Co/Ni), or $CoFeB/(A1/A2)_n$ configuration where the CoFeB layer contacts a top surface of tunnel barrier 20.

Returning to FIG. 2, a first metal layer 21 such as Mg with a thickness between 1 and 6 Angstroms is deposited by a sputter deposition method on the bottom magnetic layer. A Mg film with a thickness less than 1 Angstrom is likely to be discontinuous and comprise gaps between adjacent grains that extend vertically through the entire film. On the other hand, a Mg layer that is thicker than 6 Angstroms may not become fully oxidized during a subsequent oxidation and/or anneal step which means degraded interfacial perpendicular anisotropy along the interface 14 with the bottom magnetic layer due to the absence of a metal oxide/magnetic layer interface.

A critical feature of the tunnel barrier fabrication sequence as disclosed herein is a passive oxidation step 16 that is performed to transform an upper portion of Mg layer 21 into MgO while a lower portion of the Mg layer remains unoxidized with no cracks. The upper MgO layer 21$a$ is advantageously used to prevent oxygen during later conventional oxidation steps with oxygen pressure ≥$10^{-3}$ torr from penetrating Mg layer 21. As indicated previously, pressure of the oxygen flow in a conventional oxidation process is generally a factor of at least 10, and preferably, about 100 greater in magnitude than employed during our passive oxidation of the first Mg layer. The extremely weak oxidation condition with a maximum oxygen pressure of $10^{-5}$ torr and preferably $10^{-6}$ torr for a maximum duration of 1000 seconds guarantees that only an upper portion of the first Mg layer is oxidized and no cracks are formed through the first Mg layer. Maximum oxygen pressure is determined by controlling oxygen pressure in a closed chamber, or by controlling the oxygen flow rate in a vented chamber. Note that there are oxidized indentations 15 in oxidized layer 21a but they do not touch interface 14.

Figure 3:
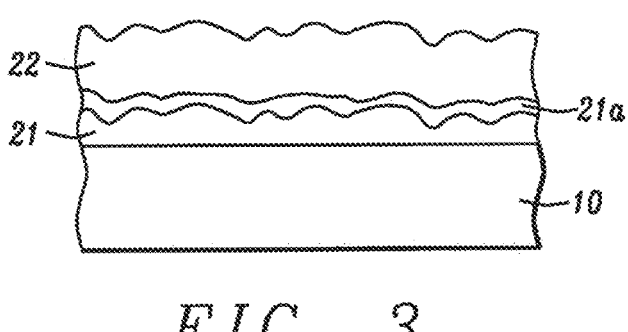
FIG. 3 is a cross-sectional view showing the deposition of a second metal layer on the metal/metal oxide tunnel barrier stack formed in FIG. 2.

Referring to FIG. 3, the following step involves the deposition of a second Mg layer 22 on oxidized layer 21a. The second Mg layer and all subsequent Mg layers have a minimum thickness of 1 Angstrom to yield a continuous film. The maximum thickness for the second Mg layer depends on the desired RA value for the tunnel barrier, the number of Mg layers deposited during tunnel barrier fabrication, and the oxidation condition employed during the second oxidation step also referred to as the first conventional oxidation process shown in FIG. 4. In general, RA tends to become larger with an increasing number of Mg layers that are oxidized with a conventional oxidation process.

Figure 4:
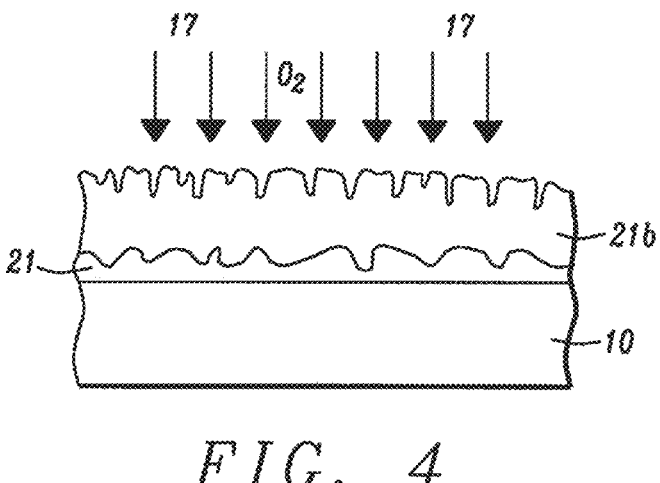
FIG. 4 is a cross-sectional view of the tunnel barrier in FIG. 3 after a second oxidation process is used to oxidize the second metal layer according to an embodiment of the present disclosure.

In FIG. 4, a first conventional oxidation process 17 that may be a natural oxidation (NOX), for example, is performed using conditions that completely convert the second Mg layer into an oxide layer. The oxidized second Mg layer and the oxidized portion of the first Mg layer form MgO layer 21b. Preferably, the oxygen flow rate during the first conventional oxidation process is at least 1 sccm for a period of 10 seconds, an oxidation condition that is considered moderate in comparison to the weak passive oxidation 16. Optionally, a relatively strong oxidation condition may be used where a flow rate of >1 sccm is applied for a period up to 600 seconds or with a pressure in the range of 0.1 mtorr to 1 torr. However, the first conventional oxidation process should not generate cracks that extend to first Mg layer 21 or allow oxygen to diffuse through MgO layer 21a to further oxidize the first Mg layer. The second Mg layer reduces the energy of oxygen that passes through layer 22 during the first conventional oxidation process, and MgO layer 21a further prevents the NOX oxygen from reaching the first Mg layer 21. The integrity of an oxidized metal layer may be determined by transmission electron microscopy (TEM) analysis to confirm whether or not cracks are created by a particular oxidation condition that may be too extreme for a certain Mg thickness. In other words, cracking is observed by TEM analysis if oxidation conditions are too strong.

Figure 5:
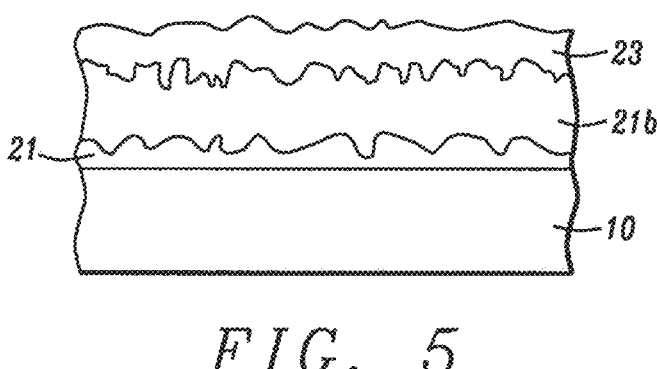
FIG. 5 is a cross-sectional view of the tunnel barrier in FIG. 4 after a third metal layer is deposited on the oxidized second metal layer.

According to one embodiment depicted in FIG. 5 that corresponds to a tunnel barrier fabrication sequence involving the fewest number of oxidation steps according to the present disclosure, an uppermost Mg layer 23 is deposited on MgO layer 21b to form a composite tunnel barrier layer 20 having a Mg/MgO/Mg configuration. As described in a later section, an anneal step (not shown) may be used following completion of the MTJ stack shown in FIG. 8 to cause diffusion of oxygen from the middle MgO layer 21b (or MgO layer 21c in an alternative embodiment where a plurality of conventional oxidation processes is performed) into Mg layers 21, 23 thereby forming a MgO layer 21d which contacts both of bottom magnetic layer 10 and top magnetic layer 30 (FIG. 9). Optionally, a passive oxidation is followed by a direct deposition of a MgO layer to give a tunnel barrier formation process with the fewest number of oxidation steps.

Figure 6:
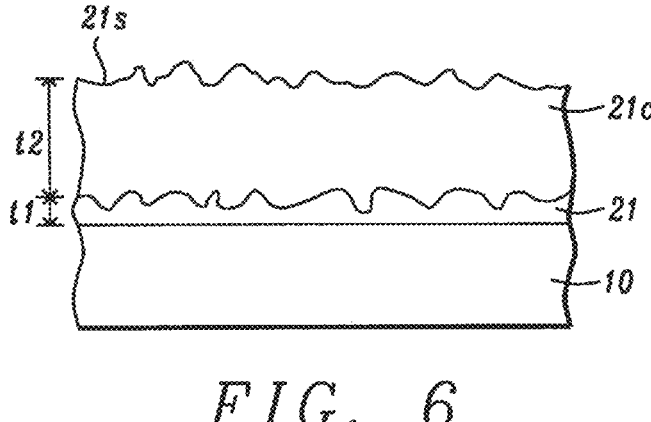
FIG. 6 is a cross-sectional view of the composite tunnel barrier in FIG. 4 after one or more metal layers are deposited and oxidized by one or more oxidation methods on the partially oxidized first metal layer according to an embodiment of the present disclosure.

In a second embodiment shown in FIG. 6, the sequence illustrated in FIGS. 3-4 may be repeated one or more times to give a MgO layer 21c having a thickness t2 on the unoxidized portion of Mg layer 21 that has a thickness t1. Thus, the MgO layer in FIG. 6 may result from a second Mg layer deposition followed by a first conventional oxidation process, and then a third Mg layer deposition (not shown) followed by a second conventional oxidation process. The second conventional oxidation may also comprise NOX conditions described previously. In the exemplary embodiment, t2>t1, but the present disclosure also anticipates a structure where t1>t2 since it is well known that MgO has a smaller lattice size than that of Mg. For instance, in an embodiment where the first Mg layer has a 3 to 4 Angstrom thickness, and each of the second and third Mg layers are about 2 Angstroms thick, oxidation of the second and third Mg layers may result in a MgO layer 21c thickness less than 4 Angstroms. It should be understood that oxidation pressure and duration used to oxidize the second Mg layer may be unequal to the oxidation pressure and duration for oxidation of the third Mg layer. Furthermore, one or both of the first and second conventional oxidation processes may include more than one step. For example, a conventional oxidation sequence may have a first step with a first oxygen flow rate and pressure, and a second step with a second oxygen flow rate and pressure unequal to the conditions in the first step. It is important that all conventional processes employed during the formation of MgO layer 21c be at least 10 to 100 times stronger in terms of oxygen pressure compared with the passive oxidation of the first Mg layer in order to ensure that the second and third Mg layers are completely oxidized.

The intermediate tunnel barrier structure depicted in FIG. 6 also encompasses a third embodiment wherein a fourth Mg layer (not shown) is deposited on the oxidized third Mg layer followed by a third conventional oxidation process to oxidize the fourth Mg layer. Thereafter, an uppermost (fifth) Mg layer (not shown) may be deposited and remains unoxidized until an optional anneal process after the MTJ stack of layers is complete. As indicated earlier, the number of Mg layers that are deposited and oxidized by a conventional oxidation process, and the thickness of each Mg layer may be adjusted to influence the RA value for the tunnel barrier. An anneal process with a temperature up to 450° C. for a duration up to 90 minutes may be employed during or after the deposition of the MTJ stack in any of the aforementioned embodiments.

The present disclosure also encompasses a tunnel barrier fabrication wherein the oxidation sequence in the second embodiment is modified such that a second passive oxidation (PO) process replaces one of the conventional oxidation processes. Thus, there may be a plurality of PO steps employed during fabrication of the tunnel barrier. In one aspect, a first Mg layer is partially oxidized by a first passive oxidation, a second Mg layer is oxidized by a first NOX step, and a third Mg layer is partially oxidized by a second passive oxidation before an uppermost Mg layer is deposited. This oxidation sequence may be represented by PO/NOX/PO. However, the second Mg layer may be partially oxidized by a second PO process and the third Mg layer may be oxidized by a NOX method in a PO/PO/NOX scheme before an uppermost Mg layer is deposited and remains unoxidized until a subsequent anneal process. Preferably, at least one NOX step is retained to ensure that a sufficient amount of oxygen is contained within the oxidized Mg layers to enable diffusion into unoxidized portions of Mg layers during the anneal process and thereby forming an essentially uniform MgO tunnel barrier, or metal oxide tunnel barrier in embodiments where the metal is not Mg.

It should be understood that the third embodiment may be modified wherein one or more of the NOX steps are replaced by a passive oxidation. According to one fabrication sequence, a first Mg layer is deposited and partially oxidized by a first passive oxidation process, a second Mg layer is deposited and oxidized by a first NOX process, a third Mg layer is deposited and oxidized by a second NOX process, and then a fourth Mg layer is deposited and partially oxidized by a second passive oxidation before the uppermost Mg layer is deposited. This oxidation scheme is represented by PO/NOX/NOX/PO. Instead of a PO/NOX/NOX/PO sequence, a series of oxidation steps represented by PO/PO/NOX/PO, PO/PO/PO/NOX, or PO/NOX/PO/PO may be used wherein at least one oxidation involves a NOX step to ensure a sufficient quantity of oxygen within the tunnel barrier layer stack to completely oxidize all metal layers therein following free layer formation and a subsequent anneal process.

The present disclosure also anticipates that the passive oxidation process may comprise nitrogen gas so that an upper portion of the first metal layer deposited in a tunnel barrier stack becomes a metal oxynitride. The first metal layer preferably has a thickness between 1 and 6 Angstroms. In an alternative embodiment, nitrogen in the absence of oxygen is used to deposit a first metal nitride layer on the first metal layer. Typically, a metal nitride is deposited by using ionized nitrogen atoms and Ar to hit a metal target. As a result, the metal nitride is sputter deposited onto a substrate. One can control the flow rate of nitrogen gas to change the ratio between Ar and ionized nitrogen atoms and thereby change the nitrogen content in the metal nitride such as MgNx. This process may be defined as a passive nitridation process if oxygen is excluded and there is a maximum nitrogen pressure of $10^{-5}$ torr. As a result, the bottom magnetic layer/first metal layer interface does not react with nitrogen and a first metal/first metal nitride stack is formed. Subsequent layers formed on the metal oxynitride or first metal nitride layer may be metal oxide layers fabricated with a conventional oxidation method of a metal layer, or by direct deposition, or one or more of the subsequent layers may have a metal oxynitride or metal nitride composition. Thereafter, an uppermost metal layer may be deposited on a top surface of an underlying metal oxide, metal oxynitride, or metal nitride layer. An anneal process at a temperature up to 450° C. and with a duration up to 90 minutes may be performed during the uppermost metal deposition or after a top magnetic layer and capping layer are sequentially formed on the uppermost metal layer.

Figure 7:
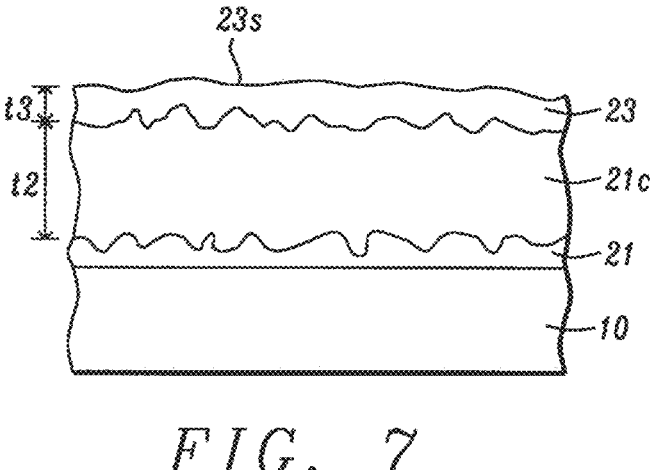
FIG. 7 is a cross-sectional view of a tunnel barrier according to the present disclosure after the deposition of an uppermost metal layer on the tunnel barrier structure shown in FIG. 6.

Referring to FIG. 7, an uppermost Mg layer 23 is deposited on MgO layer 21c once the final conventional oxidation process or second passive oxidation is completed in the aforementioned embodiments related to FIG. 6. The thickness t3 of the final Mg layer is preferably at least 1 Angstrom. A maximum thickness for t3 is determined in part by the temperature and time involved in a subsequent annealing step. In particular, t3 should not be so large that oxygen from MgO layer 21c does not diffuse into all portions of Mg layer 23 and fail to oxidize a portion thereof along top surface 23s. It is important that a metal oxide/top magnetic layer interface be formed in order to maximize PMA in the top magnetic layer. As mentioned previously, an anneal process may be employed during deposition of the uppermost metal layer 23. In addition, a second anneal process may occur after the MTJ stack is completed. As temperature is increased up to 450° C. and/or process time is lengthened in any of the anneal processes, then oxygen diffuses a greater distance into layer 23. Note that a relatively thick Mg layer 23 (t3≥3 Angstroms) will provide a substantial contribution to the final RA value. Therefore, t3 is preferably kept between 1 to 3 Angstroms. It is important that unoxidized Mg layers 21, 23 are maintained on opposite surfaces of MgO layer 21c during subsequent steps related to formation of a top magnetic layer and overlying layers such as a capping layer so that oxygen does not penetrate and oxidize a portion of the bottom magnetic layer 10 and top magnetic layer 30. Thus, metal layers 21, 23 prevent oxidation of adjoining magnetic layers but serve as a pathway for the tunnel barrier to become completely oxidized at a later time after the MTJ stack is completed.

Figure 8:
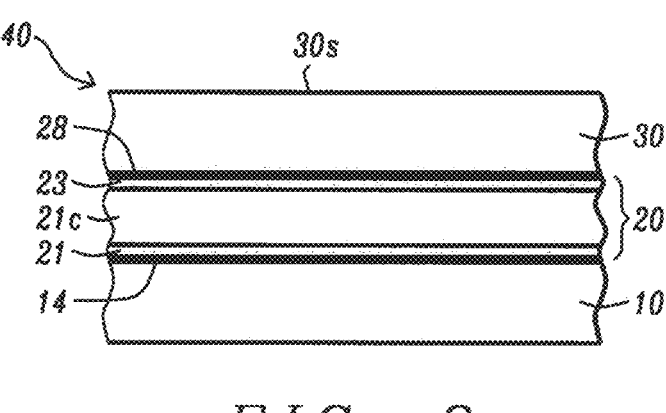
FIG. 8 is a cross-sectional view depicting a free layer formed on the tunnel barrier in FIG. 7 according to an embodiment of the present disclosure.
Figure 9:
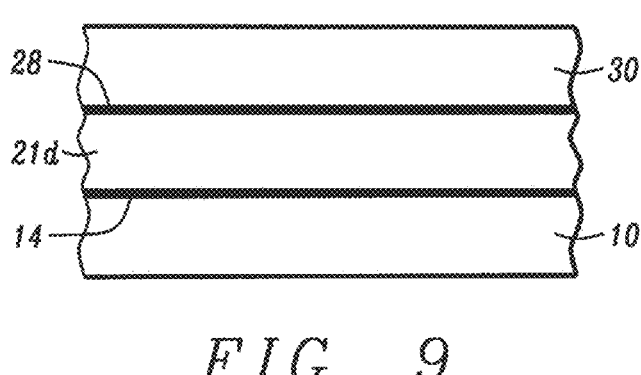
FIG. 9 is a cross-sectional view of the bottom magnetic layer/tunnel barrier/top magnetic layer stack in a bottom spin valve structure following an anneal process.

In FIG. 8 that relates to a bottom spin valve configuration, MTJ stack 40 is shown after a free layer 30 is formed as the top magnetic layer on the uppermost Mg layer 23. In this intermediate structure, a first interface 14 has a CoFeB/Mg composition, for example, while a second interface 28 may also have an Mg/CoFeB composition. In an alternative embodiment, the top magnetic layer may be comprised of Fe, or an alloy of two or more of Co, Fe, Ni, and B. The present disclosure also encompasses embodiments where the free layer has a synthetic antiferromagnetic (SAF) configuration wherein two ferromagnetic layers are separated and antiferromagnetically coupled that a layer such as Ru. Moreover, the top magnetic layer may have a moment diluting layer such as Ta or Mg formed between two magnetic layers that are ferromagnetically coupled. In yet another embodiment, the free layer may be a composite with a CoFeB, Co, or CoFe layer that has a bottom surface along interface 28, and a laminated stack such as $(Co/Ni)_n$ or (A1/A2)n described previously formed on a top surface of the CoFeB, Co, or CoFe layer.

MTJ stack 40 may further comprise a capping layer (not shown) formed on a top surface 30s of free layer 30. For example, the capping layer may include one or more of Ru and Ta to protect the free layer during subsequent process steps such as a chemical mechanical polish process that produces a smooth top surface on the MTJ stack. In another embodiment, the capping layer may be a metal oxide to generate interfacial perpendicular anisotropy along the top surface 30s and enhance PMA within the top magnetic layer. According to one aspect of the present disclosure, a metal oxide capping layer may be formed by employing the tunnel barrier formation process disclosed herein. Thus, both of the tunnel barrier layer and capping layer may be MgO, for example, that has been fabricated by depositing a first Mg layer followed by a passive oxidation step. A bottom portion of the first metal layer in the capping layer remains unoxidized to prevent oxidation of the free layer. Thereafter, at least a second Mg layer is deposited on the partially oxidized first Mg layer followed by a conventional oxidation process. The formation of an uppermost Mg layer that is not subjected to an oxidation process may be omitted during capping layer formation since there is no subsequently deposited magnetic layer that requires protection from oxidation. During the subsequent anneal process described previously, oxygen from the oxidized second Mg layer diffuses into the bottom portion of the capping layer to form a metal oxide interface with a top surface of the top magnetic layer. In an alternative embodiment, the tunnel barrier may be an oxide made of a first metal or alloy such as MgTaO while the capping layer is made of a second metal or alloy that is MgO, for example.

Referring to FIG. 9, an anneal process is employed to cause diffusion of oxygen within MgO layer 21c (FIG. 8) into adjoining Mg layers. As a result, MgO layer 21d is formed that has a bottom surface along first interface 14 and a top surface along second interface 28 to enhance PMA within bottom magnetic layer 10 and top magnetic layer 30, respectively. The anneal process comprises applying a temperature up to 450° C. for a period of up to 90 minutes. Anneal temperatures around 400° C. are preferred when the resulting MTJ structure is incorporated in a CMOS device.

According to an embodiment depicted in FIG. 10, a MTJ nanopillar 40n is fabricated after the MTJ stack is completed and annealed by following a conventional patterning and etching sequence. In the exemplary embodiment, the MTJ nanopillar is formed on a substrate 6 such as a bottom electrode. The MTJ nanopillar comprises a seed layer 8 on the substrate and an uppermost capping layer 35 having a planar top surface 35s. A sidewall 38 extends from the top surface to substrate 6. In this drawing, the x-axis and y-axis directions are in the planes of the layers while a thickness of each MTJ layer is determined along the z-axis direction. The MTJ nanopillar top surface 35s may have a circular or elliptical shape from a top-down view along the z-axis. A plurality of MTJ nanopillars is typically arrayed in a design with columns and rows on the substrate.

Figure 11:
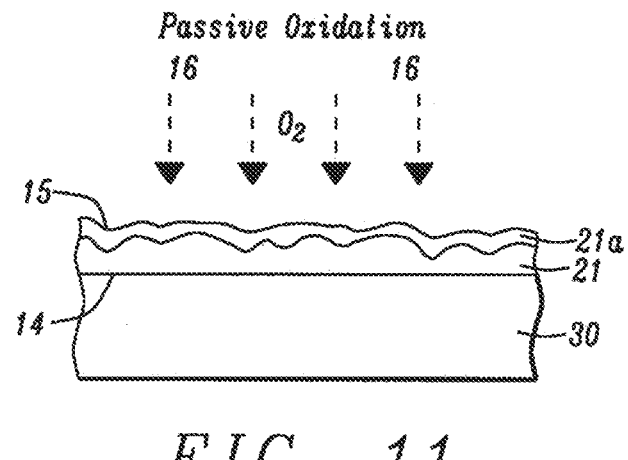
FIG. 11 is a cross-sectional view depicting the passive oxidation process on a bottom magnetic layer in a top spin valve configuration according to another embodiment of the present disclosure.

Referring to FIG. 11, the present disclosure also encompasses a method of forming a tunnel barrier in a MTJ with a top spin valve structure. In this process flow, a first metal (Mg) layer 21 is deposited on a bottom magnetic layer that is a free layer 30. Thereafter, a passive oxidation as described earlier is performed to gently oxidize a top portion of the first metal layer to form a first metal oxide layer 21a while a bottom portion of the first metal layer and bottom magnetic layer remain unoxidized.

FIG. 12 depicts a MTJ structure after one or more metal layers are deposited on metal oxide layer 21a. Each of the one or more metal layers is oxidized by a conventional oxidation process as described previously to form metal oxide layer 21c that includes the first metal oxide layer. Optionally, one of the conventional oxidation processes may be replaced by a second passive oxidation. Then, an uppermost metal layer 23 is deposited. Once the uppermost metal layer in the tunnel barrier stack is laid down, a top magnetic layer that is a reference layer 10 is deposited. The top magnetic layer forms an interface 27 with metal layer 23 while the bottom magnetic layer forms an interface 16 with first metal layer 21.

Figure 13:
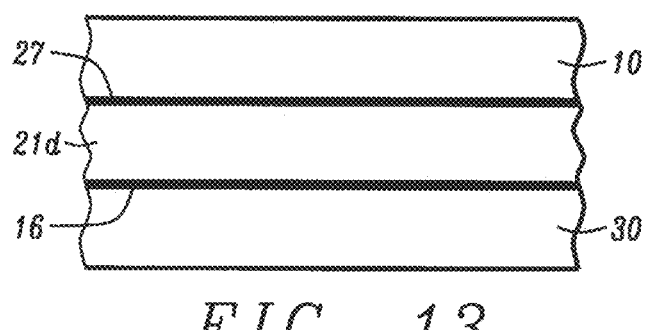
FIG. 13 is a cross-sectional view of the bottom magnetic layer/tunnel barrier/top magnetic layer stack in a top spin valve configuration following an anneal process.

FIG. 13 illustrates the MTJ structure in FIG. 12 after an anneal process is performed. As a result, metal oxide layer 21d is the tunnel barrier that has a first interface 16 with the bottom magnetic layer, and a second interface 27 with the top magnetic layer. PMA in preserved an enhanced in both magnetic layers because of the controlled oxidation processes involved in preparing the tunnel barrier, especially the passive oxidation applied to the first metal layer.

Figure 14:
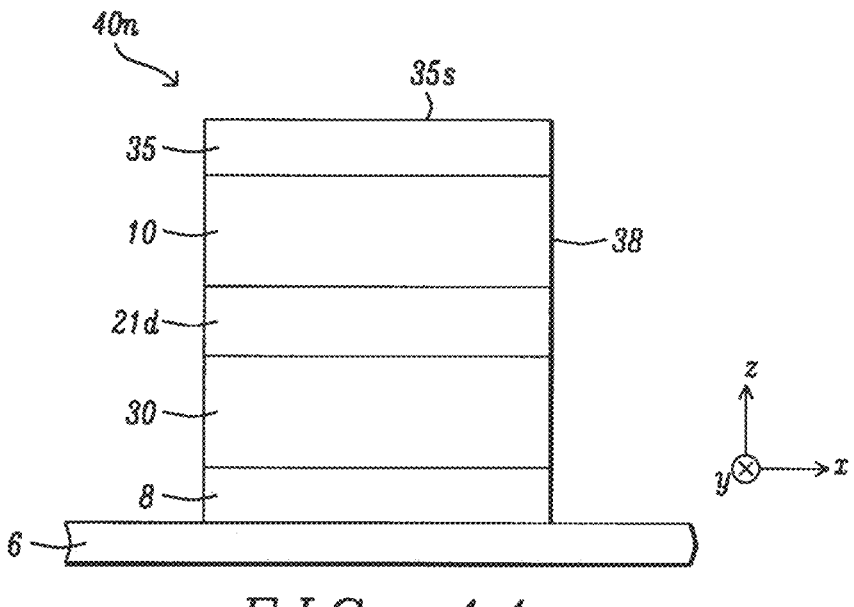
FIG. 14 is a cross-sectional view showing a MTJ nanopillar having a top spin valve configuration according to an embodiment of the present disclosure.

In FIG. 14, one example of a MTJ with a top spin valve structure having a tunnel barrier 21d formed according to an embodiment of the present disclosure is depicted. All layers are retained from the bottom spin valve stack in FIG. 10 except that magnetic layers 10 and 30 are switched.

Figure 15:
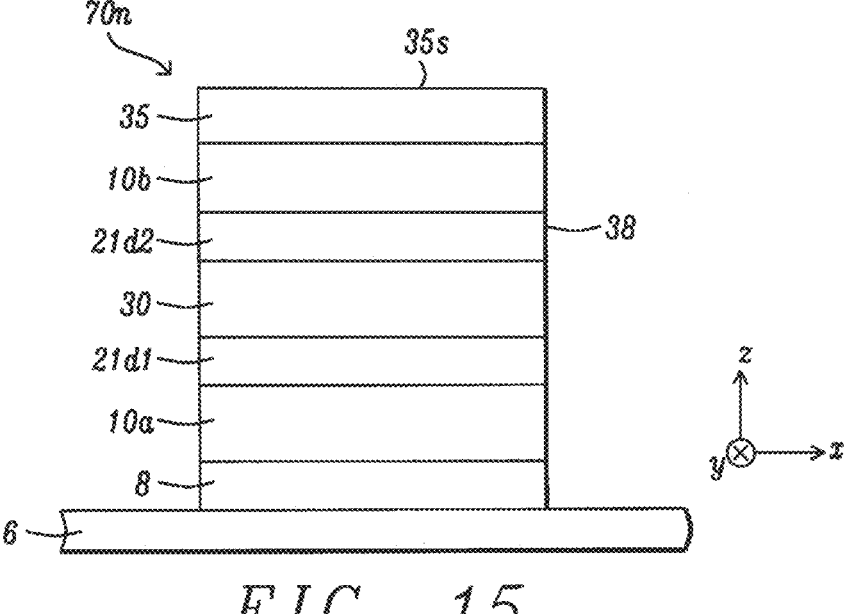
FIG. 15 shows a cross-sectional view of a dual spin valve structure wherein one or both tunnel barriers are formed by a process of the present disclosure.

Another embodiment of the present disclosure is illustrated in FIG. 15 where a MTJ nanopillar 70n has a dual spin valve structure having a first tunnel barrier 21d1 between a first reference layer 10a and free layer 30, and a second tunnel barrier 21d2 between the free layer and a second reference layer 10b. Both tunnel barrier layers may be fabricated according to a process flow that includes a passive oxidation of a first metal layer as described in one of the previously described embodiments. Alternatively, the dual spin valve may have a configuration (not shown) represented by FL1/tunnel barrier 1/reference layer/tunnel barrier 2/FL2 where FL1 is a first free layer and FL2 is a second free layer. Formation of both tunnel barriers (layers 21d1, 21d2) may proceed according to an embodiment described previously related to tunnel barrier 21d.

The dual spin valve structure may be fabricated by a sequence wherein a second tunnel barrier 21d2 is formed on stack that has a first magnetic layer 10a/first tunnel barrier 21d1/magnetic layer 30 configuration. Then a third magnetic layer 10b is deposited on the second tunnel barrier. With regard to tunnel barrier 21d2, a first metal layer (not shown) is deposited on magnetic layer 30 followed by a passive oxidation process with a maximum oxygen pressure of $10^{-5}$ torr for up to 1000 seconds. The passive oxidation process oxidizes an upper portion of the first metal layer while a bottom portion of the first metal layer at an interface with a top surface of magnetic layer 30 remains unoxidized. One or more metal oxide layers may then be formed on the oxidized upper portion of the first metal layer according to methods described in previous embodiments. Thereafter, an uppermost metal layer may be deposited on a top surface of the one or more metal oxide layers before a third magnetic layer 10b is formed. There may be a capping layer 35 formed on a top surface of magnetic layer 10b to complete the MTJ stack. An anneal process with a temperature up to 450° C. for up to 90 minutes may be performed during deposition of a first metal layer in both tunnel barriers 21d1 and 21d2, or an anneal process may be performed after all layers in the dual spin valve MTJ are formed.

Figure 16:
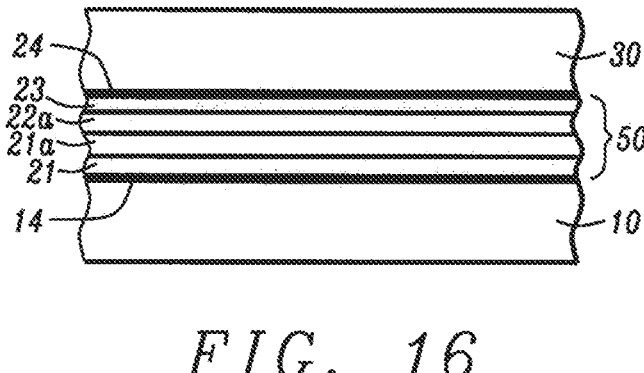
FIG. 16 is a cross-sectional view of a bottom magnetic layer/tunnel barrier/top magnetic layer stack where the tunnel barrier has a M1/M1Ox/M2Ox configuration according to an embodiment of the present disclosure.

According to another embodiment shown in FIG. 16, a composite tunnel barrier 50 is formed according to an embodiment where a first metal layer ($M_1$) 21 is deposited and an upper portion thereof is partially oxidized by a passive oxidation to form a first metal oxide layer 21a represented by a $M_1/M_1Ox$ configuration. Then, one or more metal layers made of a second metal ($M_2$) where $M_2$ with a different from that of $M_1$ may be deposited and oxidized by one or more conventional oxidation processes to form a second metal oxide layer 22a. Optionally, one of the conventional oxidation processes may be replaced by a second passive oxidation. An uppermost metal layer 23 that may have either a $M_1$ or $M_2$ composition is deposited on metal oxide layer 22a.

Figure 17:
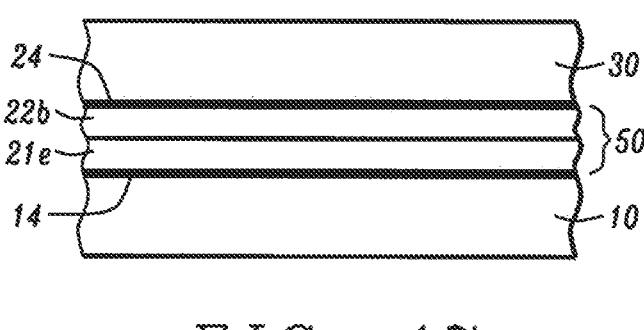
FIG. 17 is a cross-sectional view of a bottom magnetic layer/tunnel barrier/top magnetic layer stack where the tunnel barrier has a $M_1Ox/M_2Ox$ configuration following an anneal step according to an embodiment of the present disclosure.

In FIG. 17, the MTJ structure from FIG. 16 is shown after an anneal is performed wherein a first metal oxide layer 21e is formed as a result of oxygen diffusion into first metal layer 21 and oxidation thereof to yield an essentially uniform $M_1Ox$ layer from the intermediate $M_1/M_1Ox$ stack. There is also a second metal oxide layer 22b resulting from oxygen diffusion into uppermost metal layer 23 and oxidation thereof to form an essentially uniform $M_2Ox$ layer from the intermediate $M_2Ox/uppermost$ metal oxide stack. Therefore, a composite tunnel barrier 50 is formed wherein at least the first metal oxide layer is fabricated by a process including a passive oxidation of a metal layer.

The present disclosure also anticipates an embodiment relating to a STO device wherein a metal oxide layer made according to a process sequence disclosed herein adjoins a spin polarization (SP) layer in order to preserve and even enhance PMA in the SP layer. Previously, we disclosed a spin torque oscillator (STO) device in U.S. Pat. No. 8,582, 240 wherein non-magnetic layers formed adjacent to a spin polarization layer and oscillation layer may be metal oxides.

Figure 18:
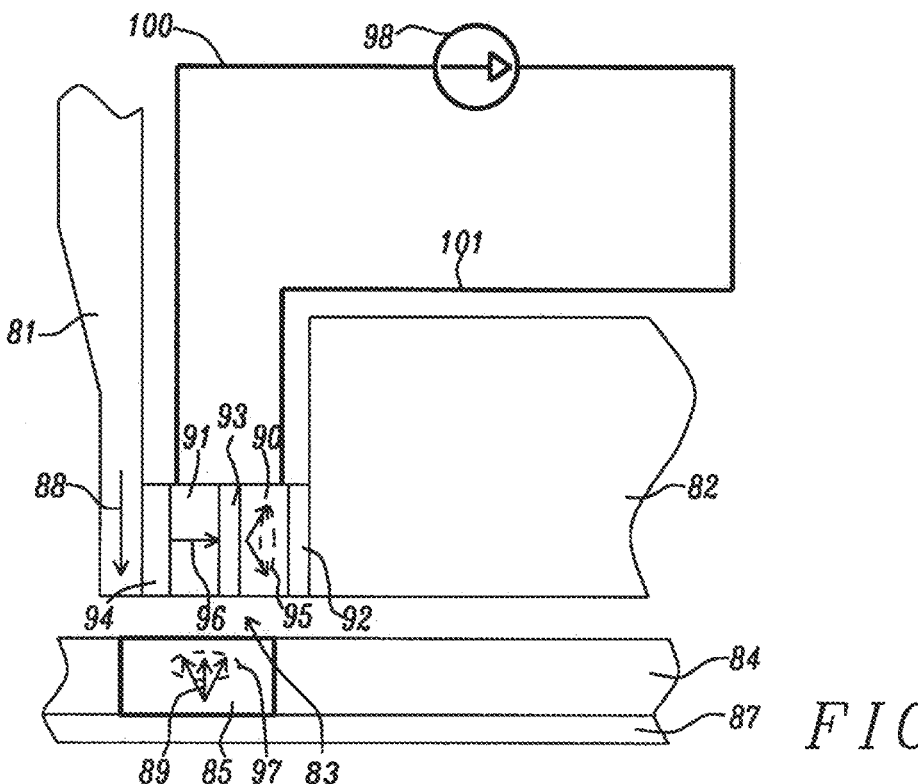
FIG. 18 is a cross-sectional view of a STO device wherein a metal oxide layer is formed by an oxidation process according to an embodiment described herein.

Referring to FIG. 18, a MAMR writer based on perpendicular magnetic recording (PMR) is depicted. There is a main pole 81 with a sufficiently large local magnetic field to write the media bit 85 in medium bit layer 84. Magnetic flux 88 in the main pole proceeds through the air bearing surface (ABS) 86-86 and into medium bit layer 84 and soft under-layer (SUL) 87. A portion of the flux (not shown) returns to the write head where it is collected by write shield 82. For a typical MAMR writer, the magnetic field generated by the main pole itself is not strong enough to flip the magnetiza-tion 89 of the medium bit in order to accomplish the write process. However, writing becomes possible when assisted by a spin torque oscillator (STO) 83 positioned between the main pole and write shield.

The STO is comprised of a high moment magnetic layer 90, and a second magnetic layer 91 that preferably has perpendicular magnetic anisotropy (PMA). Between layers 82 and 90, 90 and 91, and 91 and 81, there are nonmagnetic layers 92, 93, 94, respectively, to prevent strong magnetic coupling between adjacent magnetic layers. Non-magnetic layer 94 may be a metal oxide layer in order to form a metal oxide/magnetic layer interface with magnetic layer 91 and thereby preserving or enhancing PMA therein. Likewise, non-magnetic layer 92 may be a metal oxide layer to preserve or enhance PMA in magnetic layer 90.

An external current source 98 creates a bias current across the main pole and write shield. The applied dc results in a current flow in a direction from lead 101 into oscillation layer (OL) 90 and then through non-magnetic layer 93 and into SP layer 91 before exiting through lead 100. Direct current generated by source 98 is spin polarized by magnetic layer 91, interacts with magnetic layer 90, and produces a spin transfer torque that causes oscillation with a precession angle 95 in magnetic layer 90 hereafter called the oscillation layer (OL). The large angle oscillatory magnetization of OL 90 generates a radio frequency (1) usually with a magnitude of several to tens of GHz. This rf field (not shown) interacts with magnetization 89 of medium bit 85 and makes the magnetization oscillate into a precessional state 97 thereby reducing the coercive field of medium bit 85 to allow switching by the main pole field 88.

A key feature of the present disclosure is to provide a metal oxide composition in one or both of non-magnetic layers 92, 94 made by a passive oxidation process as disclosed in one of the previous embodiments. As a result, PMA is preserved in an adjoining magnetic layer that is SP 91 or OL 90, respectively. According to one embodiment, layer 94 is a metal oxide formed by depositing a first metal layer on the main pole layer and then performing a passive oxidation. One or more metal oxide layers are formed on the upper oxidized portion of the first metal layer before an uppermost metal layer is laid down. Then, layers 91, 93, 90, and 92 are sequentially formed before the write shield is fabricated. In one aspect, layer 92 is formed by depositing a first metal layer on OL 90 and then performing a passive oxidation. Next, one or more oxide layers are formed on an oxidized upper portion of layer 92 before an uppermost metal layer is deposited. An anneal process may be per-formed at this point or when each of the uppermost metal layers are deposited. As a result, oxidation processes to form metal oxide layers 92, 94 are well controlled and prevent substantial oxygen incursion into SP layer 91 and OL layer 90. In an alternative embodiment, the STO layers may be formed in reverse order on the main pole layer. Other aspects of previous embodiments are retained including the com-position of metal oxide layers, methods to form one or more oxide layers on the oxidized first metal layer, and an anneal process during deposition of the uppermost metal layer or after all STO layers are laid down.

Another embodiment of the present disclosure is related to a perpendicular spin torque oscillator (PSTO) device wherein a high density STO current is isolated from a low density RF generation current that we previously disclosed in U.S. Pat. No. 8,203,389. In particular, a tunnel barrier in a RF generator portion of the three terminal device may be a metal oxide layer such as MgO that is formed by a process described in a previous embodiment.

Figure 19:
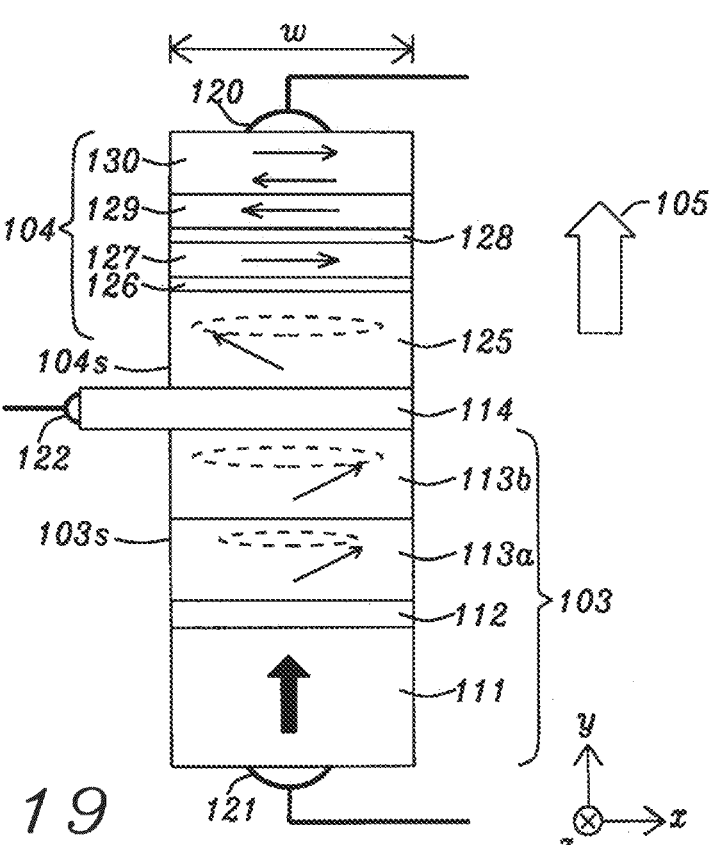
FIG. 19 is a cross-sectional view of a three terminal device wherein a tunnel barrier of a MR sensor component is formed according to an oxidation process of the present disclosure.

Referring to FIG. 19, a PSTO device is shown with a STO component 103 and a RF generation component 104 here-after referred to as "RF generator" or "MR sensor" that are separated by a non-magnetic conductive layer 114. In one aspect, STO 103 is a giant magnetoresistive junction com-prised of a PMA magnetic layer 111 that serves as a magnetic reference layer (MRL), and a stack including a first junction layer also known as non-magnetic spacer 112, second PMA magnetic layer 113a, and a soft magnetic layer 113b that are sequentially formed on the MRL. PMA layer 111 and second PMA layer 113a may be comprised of a (A1/A2$_n$ laminate as described earlier.

Spacer 112 may be made of a conductive material such as Cu, or may have a confining current pathway (CCP) con-figuration in which Cu pathways are formed in an oxide matrix such as AlOx. Layers 113a, 113b are exchange coupled to each other and form a composite magnetic oscillation layer (MOL) wherein the magnetization in each layer is free to oscillate when subjected to an applied magnetic field perpendicular to the planes of the layers, and when an electric current of sufficiently high density flows in a direction perpendicular to the planes of the layers from a first electrical terminal 122 to a second electrical terminal 121. The high current density is preferably in the range of $1 \times 10^7$ to $1 \times 10^9$ Amps/cm$^2$ in order to exceed the critical current density for causing a spin torque effect on the MOL. It is believed that reflected electrons from the MRL/spacer interface excite the MOL layer and thereby induce an oscillation state in layers 113a, 113b with significant in-plane amplitude. Note that PMA layer 113a has the same oscillation frequency as soft magnetic layer 113b but a smaller in-plane magnetization component. Soft magnetic layer 113b may be made of CoFe, a CoFe alloy, or a composite thereof.

Non-magnetic conductive layer 114 is preferably a metal made of Cu or the like, or a metal alloy having a bottom surface that contacts an uppermost layer of STO 103, and with a top surface that adjoins a bottom layer in RF generator 104. Preferably, conductive layer 114 has a width in an in-plane direction along the x-axis that is greater than the width w of the layers in the STO and RF generator in order to allow an electrical connection to a first electrical terminal hereafter referred to as first terminal 122.

According to one embodiment, RF generator 104 is a magnetoresistive (MR) sensor with a TMR configuration in which a MTJ has a magnetic sensing layer 125, a second junction layer hereafter referred to as tunnel barrier 126, reference layer 127, exchange coupling layer 128, pinned layer 129, and AFM layer 130 are sequentially formed on a top surface of conductive layer 114. Optionally, when ref-erence layer 127 has PMA, layers 128-130 may be omitted. An important feature is that magnetic sensing layer 125 should have a Mst value within about +50% of the Mst value for MOL layer (113a, 113b). Moreover, magnetic sensing layer 125 may be a single layer or a composite and is magnetostatically coupled to soft magnetic layer 113b such that when an oscillating state is established in the MOL, an oscillation state is induced in the sensing layer with sub-stantially the same frequency as in layers 113a, 113b. Preferably, in an embodiment wherein MR sensor 104 and STO 103 have essentially the same width w, the MR sensor is aligned vertically above the STO such that sidewalls 103s, 104*s* are substantially coplanar in order to provide an efficient magnetostatic coupling between soft magnetic layer 113*b* and sensing layer 125. A key aspect is that tunnel barrier 126 is a metal oxide made by a process including partial oxidation of a first metal layer by a passive oxidation process as described previously to preserve PMA in magnetic sensing layer 125, and in reference layer 127 in an embodiment where layers 128-130 are omitted. As a result, RF generator 104 has lower RA and higher TMR ratio compared with prior art PSTO devices where the tunnel barrier is fabricated by conventional oxidation processes.

During an operating mode, an external magnetic field 105 is applied to the entire PSTO structure including STO 103 and. RF generator 104 in either a (+) or (−) y-axis direction to align the perpendicular magnetization components of MRL 111, MOL 113*a*/113*b*, and magnetic sensing layer 125 in the same direction as the field direction. Preferably, MRL 111 has an entirely perpendicular to plane magnetization orientation while the MOL and magnetic sensing layer magnetizations are tilted partially out of the film plane. When a high density current flows from first terminal 122 to second terminal 121, electrons pass through the MOL layer to MRL 111. A portion of the electrons are reflected from the MRL/spacer 112 interface back into the MOL to excite the MOL magnetization from a quiescent state into a significant in-plane oscillation. Subsequently, the oscillating in-plane magnetization component in MOL 113*a*/113*b* produces an oscillating magnetic field in magnetic sensing layer 125. The in-plane magnetization oscillation of the magnetic sensing layer has a 180 degree phase difference compared with that of MOL which means the MOL and magnetic sensing layer are in a pseudo anti-ferromagnetic coupled FMR mode. Therefore, with magnetic sensing layer 25 being part of MR sensor 104 and a DC current flowing between first terminal 122 and third terminal 120 in either direction, an AC voltage signal can be generated between the first and third terminals from a resistance change in the MR sensor due to magnetostatic coupling between the magnetic sensing layer and the oscillating MOL.

Figure 20:
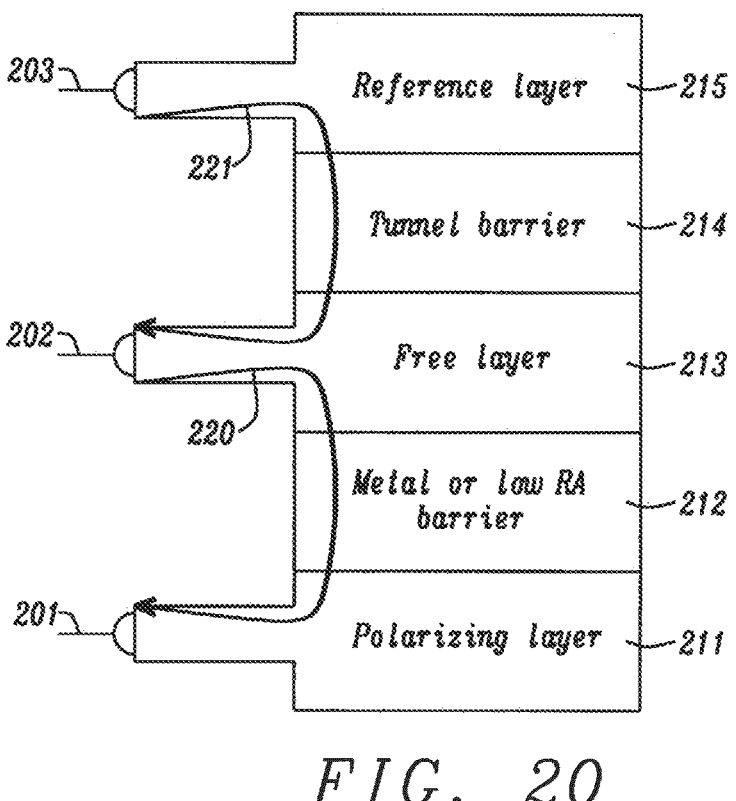
FIGS. 20-21 are embodiments of a three terminal spin-transfer switching device where one or both of the tunnel barrier and low RA tunnel barrier are formed according to an oxidation process of the present disclosure.

According to another embodiment, a three terminal spin-transfer switching device shown in FIG. 20 may comprise a tunnel barrier layer and a low RA barrier formed by using the passive oxidation process and one or more methods such as NOX and RF sputtering described previously. Similar to the three terminal structure we have disclosed in U.S. Pat. No. 7,978,505, three magnetic layers including a polarizing layer, free layer, and a reference layer are separated by two non-magnetic layers. In FIG. 20, the non-magnetic layer 214 between the free layer 213 and the reference layer 215 is a tunnel barrier with normal RA to produce the read signal in the read circuit 221, which contains the free layer and its terminal (electrode 202), the normal RA tunnel barrier, the reference layer and its terminal (electrode 203) and the source of read signal and a detecting setup, a sense amplifier (not shown), for example. The non-magnetic layer 212 between the free layer and the polarizing layer 211 may be a metal layer or a low RA tunnel barrier to produce the spin-transfer torque for switching the free layer in the write circuit 220, which contains the free layer and its terminal (electrode 202), the metal spacer or low RA tunnel barrier, the polarizing layer and its terminal (electrode 201) and the source of writing voltage (not shown). The separation of the write and read circuits ensures that the write circuit, where the writing current can be much larger than that in a normal two terminal device, has a low RA while the read circuit has a normal RA to generate decent read signals. The previously disclosed oxidation process may be used to fabricate the normal RA barrier 214 to enhance MR ratio and preserve PMA, and may also be employed in formation of the low RA barrier 212 to further reduce the RA value.

Figure 21:
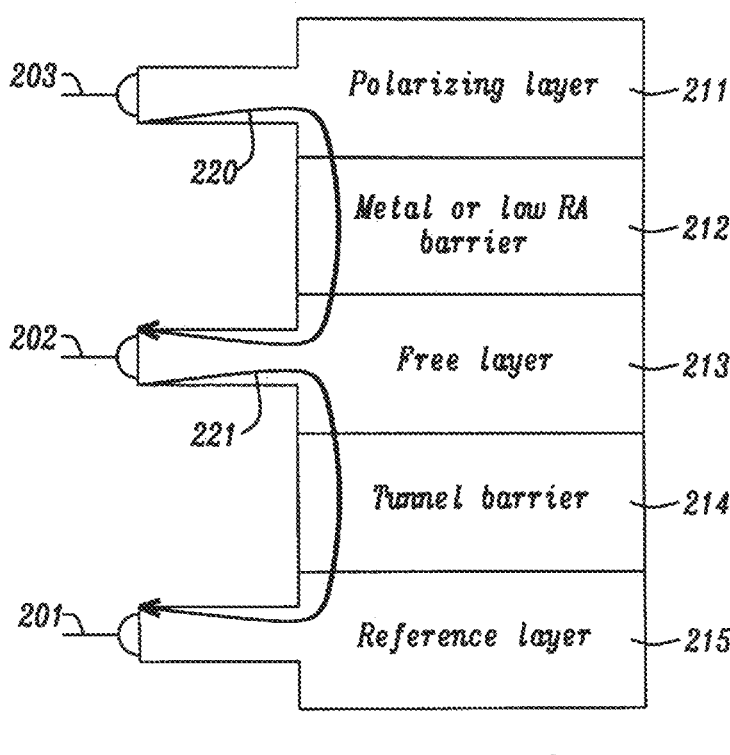

In an alternative embodiment depicted in FIG. 21, the order of forming the layers 211-215 in the three terminal device shown in FIG. 20 may be reversed such that the reference layer 215 is formed as the bottommost layer followed by the tunnel barrier 214, free layer 213, metal or low RA barrier 212, and a polarizing layer as the uppermost layer. In this case, the read circuit 221 comprises a first terminal (electrode 201) attached to the reference layer, a second terminal (electrode 202) connected to the free layer, and layers 213-215 between the first and second terminals. Meanwhile, the write circuit 220 comprises the second terminal, a third terminal (electrode 203) attached to the polarizing layer, and layers 211-213 between the second and third terminals.

To demonstrate the effectiveness of the tunnel barrier fabrication method of the present invention, an experiment was performed to build MTJ nanopillars in 10 Mb memory device arrays with a reference layer/MgO tunnel barrier/free layer/cap layer configuration. A current-in-plane tunneling (CIPT) technique was used to measure RA of the stack and TMR ratio of each MTJ nanopillar. In all examples in Table 1, the bottom and top magnetic layers that adjoin the tunnel barrier are both CoFeB and the capping layer is MgO.

A conventional tunnel barrier formation process currently practiced by the inventors is used for the MTJ shown in row 1 of Table 1 and includes deposition of three Mg layers with thicknesses of 6.6 Angstroms (first Mg layer), 3 Angstroms (second Mg layer), and 2.5 Angstroms for the uppermost Mg layer. The first Mg layer is oxidized with a NOX process comprised of a 5 sccm $O_2$ flow rate for 80 seconds, and the second Mg layer is oxidized with a two part NOX process where the first step has a 5 sccm $O_2$ flow rate for 20 seconds and the second step has a $O_2$ pressure control of 1 torr for 600 seconds. After the third Mg layer is deposited on the oxidized second Mg layer and a capping layer is formed as the uppermost layer, the complete MTJ is annealed with a process comprising 400° C. for 30 minutes that is common to all three MTJ nanopillar structures.

Row 2 represents MTJ with an Mg0 tunnel barrier built according to an embodiment of the present disclosure. A key feature is that the first Mg layer with a 3.3 Angstrom thickness is treated with a passive oxidation (PO) method with an oxygen flow pressure<$10^{-6}$ torr for 20 seconds. Then a second Mg layer with a 3.3 Angstrom thickness is deposited and a NOX process is performed with a 5 sccm $O_2$ flow rate for 80 seconds. Next, a third Mg layer is deposited and a two part NOX process is applied wherein a first step comprises a 5 sccm $O_2$ flow rate for 20 seconds, and a second step has a pressure control at 1 torr for 600 seconds. Finally, a fourth Mg layer with a 2.5 Angstrom thickness is deposited and the structure is annealed at 400° C. after the MTJ stack is completed.

Row 3 represents a MTJ with an Mg0 tunnel barrier built according to another embodiment of the present disclosure. A key feature is that the first Mg layer with a 2.75 Angstrom thickness is treated with a passive oxidation (PO) method with an oxygen flow pressure of <$10^{-6}$ torr for 20 seconds. Then a second Mg layer with a 2.25 Angstrom thickness is deposited and a NOX process is performed with a 5 sccm $O_2$ flow rate for 80 seconds. Next, a third Mg layer with a 3 Angstrom thickness is deposited and a two part NOX process is applied with a 5 sccm, 20 second $O_2$ flow for the first step and a 18 sccm, 500 second $O_2$ flow for the second step. Then a fourth Mg layer having a 4.5 Angstrom thickness is deposited and a third NOX process is performed wherein $0_2$ flow rate is 5 sccm for 20 seconds. Finally, a fifth Mg layer with a 2.5 Angstrom thickness is deposited and the structure is annealed at 400° C. after the MTJ stack is completed.

In rows 1 and 2 in Table 1, the total thickness of all deposited Mg layers is around 12 Angstroms. There are five separate Mg layers in the third example (row 3 process) with a combined thickness of 15 Angstroms that leads to a slightly higher RA value than in row 2 but RA is still lower than that shown for the MTJ in row 1.

TABLE 1

| # | Magnetic Properties of patterned MTJ nanopillars with CoFeB/MgO/CoFeB/MgO configuration after anneal at 400° C. for 30 min. | | |
| --- | --- | --- | --- |
| # | MgO tunnel barrier formation process | RA | TMR % |
| 1 | Mg6.6/NOX(5 sccm, 80 s)/3Mg/NOX(5 sccm, 20 s)/NOX(1 torr, 600 s)/Mg2.5 | 20 | 130 |
| 2 | Mg3.3/PO(<10⁻⁶ torr, 20 s)/3.3Mg/NOX(5 sccm, 80 s)/3Mg/NOX(5 sccm, 20 s)/NOX(1 torr, 600 s)/Mg2.5 | 12 | 140 |
| 3 | Mg2.75/PO(<10⁻⁶ torr, 20 s)/2.25Mg/NOX(5 sccm, 80 s)/3Mg/NOX(5 sccm, 20 s + 18 sccm, 500 s)/Mg4.5/NOX(5 sccm, 20 s)/Mg2.5 | 17 | 140 |

A comparison of MTJ nanopillar in row 2 to the conventional MTJ in row 1 clearly indicates several benefits associated with having a passive oxidation as the initial oxidation step in fabricating a tunnel barrier. In particular, there is an increase in TMR ratio from 130% to 140%, and a decrease in RA from 20 to 12. It is important to note that the increase in TMR ratio is due to better preservation of PMA in the CoFeB magnetic layers. The row 3 MTJ nanopillar has a tunnel barrier made with a process that has one additional Mg layer deposition and an extra NOX oxidation compared with the MTJ in row 2 to intentionally produce a thicker MgO layer with slightly higher RA. The example in row 3 also exhibits a better TMR ratio and lower RA compared with the MTJ in row 1 with a conventional MgO tunnel barrier. Thus, we have demonstrated that the improved tunnel barrier formation process described herein has flexibility in fabricating a variety of tunnel barriers.

Table 1 results suggest that the tunnel barrier fabrication of the present disclosure enables PMA in the reference layer and free layer to be maintained or even enhanced as demonstrated by the larger TMR ratio. Moreover, thermal stability of at least 400° C. in MTJ nanopillars which is required for compatibility with CMOS processes is achieved since all of the desired properties in Table 1 were measured after an anneal process for 30 minutes at 400° C. An elevated anneal temperature near 400° C. is also beneficial in crystallizing amorphous magnetic layers such as CoFeB and the MgO tunnel barrier to ensure a higher TMR ratio.

While this disclosure has been particularly shown and described with reference to, the preferred embodiment thereof, it will be understood by those skilled in the art that various changes in form and details may be made without departing from the spirit and scope of this disclosure.

What is claimed is:

1. A method, comprising:
providing a MAMR writer including a main pole, a write shield, and a spin torque oscillator (STO) positioned between the main pole and the write shield, wherein providing the STO comprises:

forming a first magnesium layer along a side of the main pole;
performing a passive oxidation process to the first magnesium layer to partially oxidize the first magnesium layer;
forming a second magnesium layer on the partially oxidized portion of the first magnesium layer;
performing a second oxidation process to fully oxidize the second magnesium layer;
after performing a first annealing process during deposition of a third magnesium layer over the fully oxidized second magnesium layer, performing a second annealing process, wherein after the performing the second annealing process, each of the first, second, and third magnesium layers are fully oxidized; and
sequentially forming, adjacent to the third magnesium layer, a magnetic layer, a non-magnetic layer, a high moment magnetic layer, and a metal oxide layer.

2. The method of claim 1, wherein the write shield is provided after the sequentially forming the magnetic layer, the non-magnetic layer, the high moment magnetic layer, and the metal oxide layer.

3. The method of claim 1, further comprising after the sequentially forming the magnetic layer, the non-magnetic layer, the high moment magnetic layer, and the metal oxide layer, performing a third annealing process.

4. The method of claim 1, wherein after forming the second magnesium layer and prior to deposition of the third magnesium layer, performing a third annealing process.

5. The method of claim 1, wherein the forming of the metal oxide layer further comprises:
forming a fourth magnesium layer;
performing an oxidation process to partially oxidize the fourth magnesium layer; and
forming a fifth magnesium layer over the partially oxidized fourth magnesium layer.

6. The method of claim 1, wherein the method further comprises:
providing a soft underlayer and a medium bit layer disposed on the soft underlayer, wherein the main pole is configured to generate a local magnetic field for interaction with the medium bit layer, and wherein the local magnetic field is configured to flip a magnetization of a medium bit of the medium bit layer with assistance of the STO positioned between the main pole and the write shield.

7. The method of claim 6, wherein the high moment magnetic layer includes an oscillation layer configured to generate a radio frequency (RF) field for interaction with the medium bit layer, and wherein the RF field is configured to reduce a coercive field of the medium bit.

8. The method of claim 1, wherein the passive oxidation process is performed at a first oxygen pressure, and wherein the second oxidation process is performed at a second oxygen pressure greater than the first oxygen pressure.

9. A method, comprising:
providing a main pole;
forming a first metal oxide layer adjacent a side of the main pole;
forming a magnetic layer adjacent the first metal oxide layer;
forming a non-magnetic layer adjacent the magnetic layer and opposite the first metal oxide layer;
forming a high moment magnetic layer adjacent the non-magnetic layer and opposite the magnetic layer;

forming a second metal oxide layer adjacent the high moment magnetic layer and opposite the non-magnetic layer, and forming a write shield adjacent the second metal oxide layer and opposite the high moment magnetic layer;

wherein forming one or both of the first metal oxide layer and the second metal oxide layer comprises:

forming a first magnesium layer;

performing a passive oxidation process that partially oxidizes the first magnesium layer;

forming a second magnesium layer over the partially oxidized first magnesium layer;

performing a second oxidation process to fully oxidize the second magnesium layer;

performing a first annealing process during deposition of a third magnesium layer over the fully oxidized second magnesium layer; and after performing the first annealing process, performing a second annealing process.

10. The method of claim 9, wherein after the performing the second annealing process, each of the first, second, and third magnesium layers are fully oxidized.

11. A method, comprising:

providing a soft underlayer and a medium bit layer disposed on the soft underlayer;

providing a main pole;

forming a spin torque oscillator (STO) adjacent to the main pole, wherein forming the STO includes:

forming a first non-magnetic layer adjacent a side of the main pole;

forming a magnetic layer adjacent the first non-magnetic layer;

forming a second non-magnetic layer adjacent the magnetic layer and opposite the first non-magnetic layer;

forming a high moment magnetic layer adjacent the second non-magnetic layer and opposite the magnetic layer; and forming a metal oxide layer adjacent the high moment magnetic layer and opposite the second non-magnetic layer, wherein forming the metal oxide layer includes:

forming a first magnesium layer;

performing a passive oxidation process that partially oxidizes the first magnesium layer;

forming a second magnesium layer over the partially oxidized first magnesium layer;

performing a second oxidation process to fully oxidize the second magnesium layer;

performing a first annealing process during deposition of a third magnesium layer over the fully oxidized second magnesium layer; and after performing the first annealing process during deposition of the third magnesium layer, performing a second annealing process; and forming a write shield adjacent the metal oxide layer and opposite the high moment magnetic layer.

12. The method of claim 11, wherein the forming of the first non-magnetic layer further comprises:

forming a first metal layer;

performing an oxidation process to oxidize an upper portion of the first metal layer while a bottom portion of the first metal layer remains unoxidized; and forming a second metal layer over the upper portion of the first metal layer.

13. The method of claim 12, wherein the forming of the first non-magnetic layer further comprises forming a third metal layer over the second metal layer.

14. The method of claim 13, wherein the forming of the first non-magnetic layer further comprises performing another annealing process during the forming of the third metal layer.

15. The method of claim 11, wherein the medium bit layer includes a medium bit having a magnetization.

16. The method of claim 15, wherein the main pole is configured to generate a local magnetic field to flip the magnetization of the medium bit with assistance of the STO positioned between the main pole and the write shield.

17. The method of claim 11, wherein the high moment magnetic layer includes an oscillation layer.

18. The method of claim 17, wherein the oscillation layer is configured to generate a radio frequency (RF) field for interaction with the medium bit layer.

19. The method of claim 18, wherein the RF field is configured to reduce a coercive field of a medium bit of the medium bit layer.

20. The method of claim 11, wherein the passive oxidation process is performed at a first oxygen pressure, and wherein the second oxidation process is performed at a second oxygen pressure greater than the first oxygen pressure.

* * * * *